(12) United States Patent
Nakajima

(10) Patent No.: US 11,937,346 B2
(45) Date of Patent: Mar. 19, 2024

(54) LIGHT EMITTING DEVICE

(71) Applicants: PIONEER CORPORATION, Tokyo (JP); TOHOKU PIONEER CORPORATION, Tendo (JP)

(72) Inventor: Shinji Nakajima, Yonezawa (JP)

(73) Assignees: PIONEER CORPORATION, Tokyo (JP); TOHOKU PIONEER CORPORATION, Yamagata (JP)

( * ) Notice: Subject to any disclaimer, the term of this patent is extended or adjusted under 35 U.S.C. 154(b) by 9 days.

(21) Appl. No.: 17/641,063

(22) PCT Filed: Sep. 4, 2020

(86) PCT No.: PCT/JP2020/033594
§ 371 (c)(1),
(2) Date: Mar. 7, 2022

(87) PCT Pub. No.: WO2021/049433
PCT Pub. Date: Mar. 18, 2021

(65) Prior Publication Data
US 2022/0338317 A1 Oct. 20, 2022

(30) Foreign Application Priority Data
Sep. 12, 2019 (JP) .................................. 2019-165939

(51) Int. Cl.
*H05B 33/22* (2006.01)
*H05B 33/04* (2006.01)
*H05B 33/14* (2006.01)

(52) U.S. Cl.
CPC ............. *H05B 33/22* (2013.01); *H05B 33/04* (2013.01); *H05B 33/14* (2013.01)

(58) Field of Classification Search
CPC .......... H05B 33/22; H05B 33/04; H05B 33/14
See application file for complete search history.

(56) References Cited

U.S. PATENT DOCUMENTS

| 7,109,653 B2 | 9/2006 | Imamura |
| 7,524,228 B2 | 8/2009 | Imamura |

(Continued)

FOREIGN PATENT DOCUMENTS

| CN | 101083294 A | * 12/2007 | ............. H05B 33/22 |
| CN | 109065763 A | 12/2018 | |

(Continued)

OTHER PUBLICATIONS

International Search Report dated Oct. 13, 2020, issued in International Application No. PCT/JP2020/033594, 2 pages.

(Continued)

*Primary Examiner* — Mary Ellen Bowman
(74) *Attorney, Agent, or Firm* — Procopio, Cory, Hargreaves & Savitch LLP

(57) ABSTRACT

A first side surface (312) is positioned at a light emitting region (142) side. The first side surface (312) is inclined toward the light emitting region (142) with distance from the first surface (102) of the substrate (100). A second side surface (314) is positioned opposite to the first side surface (312). The second side surface (314) is inclined away from the light emitting region (142) with distance from the first surface (102) of the substrate (100). A first upper surface (316) is positioned between the first side surface (312) and the second side surface (314), and is substantially parallel to the first surface (102) of the substrate (100).

7 Claims, 8 Drawing Sheets

(56) References Cited

U.S. PATENT DOCUMENTS

| | | |
|---|---|---|
| 7,928,656 B2 | 4/2011 | Imamura |
| 9,190,630 B2 | 11/2015 | Kim et al. |
| 9,997,736 B2 | 6/2018 | Okamoto et al. |
| 10,396,256 B2 | 8/2019 | Wei et al. |
| 10,468,469 B2 | 11/2019 | Tsai et al. |
| 10,644,259 B2 | 5/2020 | Wei et al. |
| 11,050,040 B2 | 6/2021 | Luo |
| 11,094,915 B2 * | 8/2021 | Okada ................ H10K 50/8445 |
| 11,588,134 B2 | 2/2023 | Wang et al. |
| 2003/0164674 A1 | 9/2003 | Imamura |
| 2004/0000863 A1 * | 1/2004 | Miyake ............. H10K 50/8445 313/504 |
| 2006/0270305 A1 | 11/2006 | Imamura |
| 2009/0179566 A1 | 7/2009 | Imamura |
| 2012/0205675 A1 * | 8/2012 | Yamazaki ............. H10K 59/86 257/40 |
| 2014/0131683 A1 * | 5/2014 | Kim ...................... H10K 71/00 438/22 |
| 2017/0352832 A1 * | 12/2017 | Okamoto ............. H10K 50/82 |
| 2019/0058020 A1 * | 2/2019 | Tsai ..................... H10K 59/131 |
| 2019/0058094 A1 | 2/2019 | Wei et al. |
| 2019/0058158 A1 | 2/2019 | Wei et al. |
| 2020/0044190 A1 * | 2/2020 | Luo .................... H10K 50/8445 |
| 2021/0143368 A1 | 5/2021 | Wang et al. |

FOREIGN PATENT DOCUMENTS

| | | | |
|---|---|---|---|
| CN | 110148617 A | 8/2019 | |
| JP | 2012-253036 A | 12/2012 | |
| JP | 2019-117783 A | 7/2019 | |
| KR | 10-2017-0080224 A | 7/2017 | |
| WO | WO-2015174464 A1 * | 11/2015 | ............... G02B 5/20 |
| WO | 2016-098655 A1 | 6/2016 | |
| WO | WO-2018229991 A1 * | 12/2018 | ............... G09F 9/30 |

OTHER PUBLICATIONS

Japanese Office Action received in JP Application No. 2023-127840, dated Jan. 30, 2024, 3 pages.

* cited by examiner

LIGHT EMITTING DEVICE

CROSS-REFERENCE TO RELATED APPLICATIONS

This application is a U.S. National Stage entry of PCT Application No: PCT/JP2020/033594 filed Sep. 4, 2020, which claims priority to Japanese Patent Application No. 2019-165939 filed Sep. 12, 2019, the contents of which are incorporated herein by reference.

TECHNICAL FIELD

The present invention relates to a light emitting device.

BACKGROUND ART

In recent years, a light emitting device having an organic electroluminescence (EL) element has been developed. Such a light emitting device has a sealing structure for sealing the organic EL element (light emitting portion). Examples of the sealing structure include a sealing layer covering the light emitting portion, or a sealing member (for example, a sealing can) adhered to a substrate through an adhesive layer.

Patent Document 1 discloses an example of a sealing structure of a light emitting device. The light emitting device includes a resin structure. The structure surrounds the light emitting portion. The structure is treated with liquid repellent. The light emitting portion is covered with a resin layer. An end portion of the resin layer is dammed by the structure. Accordingly, a position of the end portion of the resin layer can be adjusted by a position of the structure.

RELATED DOCUMENT

Patent Document

[Patent Document 1] Japanese Unexamined Patent Publication No. 2012-253036

SUMMARY OF THE INVENTION

Technical Problem

For example, as disclosed in Patent Document 1, the position of the end portion of the resin layer may be adjusted by the position of the structure. The present inventor has studied to adjust the position of the end portion of the resin layer in accordance with the position of the structure by a structure different from the structure disclosed in Patent Document 1.

Examples of the problem to be solved by the present invention include adjustment of the position of the end portion of the resin layer by the position of the structure.

Solution to Problem

The invention according to claim 1 relates to a light emitting device including a substrate, a light emitting portion positioned over the substrate, a structure surrounding a light emitting region including the light emitting portion, a sealing layer covering the light emitting portion and the structure, and a resin layer covering at least a portion of the sealing layer overlapping with the light emitting region, in which the structure includes a first side surface positioned at the light emitting region side, and a second side surface positioned opposite to the first side surface and inclined away from the light emitting region with distance from the substrate.

DESCRIPTION OF EMBODIMENTS

Figure 1:
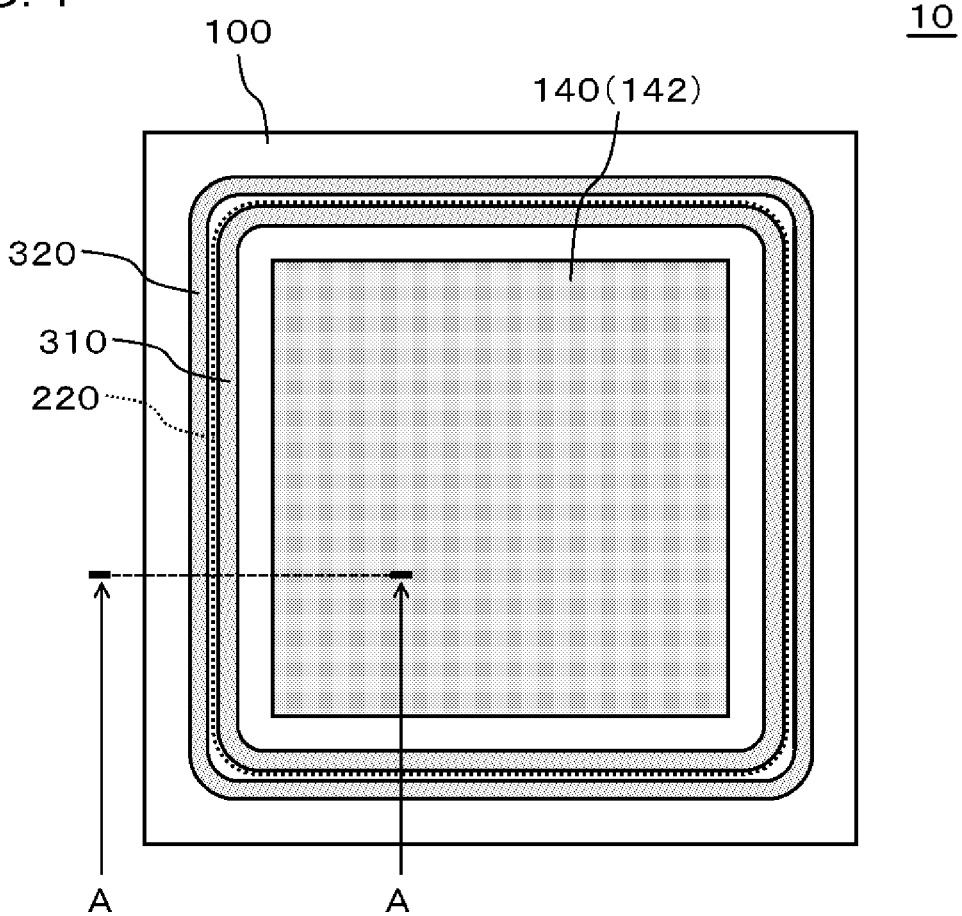
FIG. 1 is a plan view of a light emitting device according to Embodiment 1.

An expression "A is positioned over B" in the present specification may mean that A is directly positioned on B with no different element (for example, a layer) positioned between A and B or may mean that a different element (for example, a layer) is partially or fully positioned between A and B. Furthermore, expressions indicating orientations, such as "up", "down", "left", "right", "front", and "back" are basically used in accordance with orientations in the drawings and are not interpreted to be limited to, for example, orientations in which an invented product described in the present specification is used.

In the present specification, the expression "convex" means, unless otherwise noted, an aspect protruding from a certain surface, and is not used to limit the aspect. For example, one aspect of the convex simply protrudes straight from a surface. Another aspect curvedly protrudes from a certain surface.

In the present specification, the term "angle" may be defined for the intersection of two lines. The expression "angle formed by A and B" means one angle formed by the intersection of one tangent line that passes through one point of A and one tangent line that passes through one point of B. A and B may be spaced from each other. An example of the "angle formed by a surface A and a surface B" is one angle formed by the intersection of a first tangent line to the line indicating the surface A and a second tangent line to the line indicating the surface B in the cross-sectional view including the surface A and the surface B.

In the present specification, the expression "A and B overlap with each other" means that at least a part of A is positioned at the same place as at least a part of B on a projection image from a certain direction, unless otherwise noted. In this case, a plurality of elements may be directly in contact with each other or may be spaced from each other.

In the present specification, the expression "outside A" means a portion at a side where A is not positioned with respect to an edge of A, unless otherwise noted.

An anode in the present specification refers to an electrode from which a hole is injected into a layer containing a light emitting material (for example, an organic layer) and a cathode refers to an electrode from which an electron is injected into the layer containing the light emitting material. In addition, expressions "anode" and "cathode" may also mean different terms such as "hole injection electrode" and "electron injection electrode" or "positive electrode" and "negative electrode".

In the present specification, the expression "end of A" means a boundary between A and other elements when viewed from one direction, the expression "end portion of A" is a part of regions of A including the boundary, and the expression "end point of A" means one point on the boundary.

"Light emitting device" in the present specification includes devices having a light emitting element such as a display, lighting, or the like. In addition, "light emitting device" may include wires, integrated circuits (ICs), casing, or the like that are directly, indirectly, or electrically connected to the light emitting element.

The expression "connect" in the present specification refers to a state in which a plurality of elements are directly or indirectly connected. For example, a case where a plurality of elements are connected through an adhesive or a joining member may also be simply expressed as "a plurality of elements are connected". In addition, a case where a member capable of supplying or transmitting a current, a voltage, or a potential is present between a plurality of elements and "a plurality of elements are electrically connected" may also be simply expressed as "a plurality of elements are connected".

In the present specification, unless otherwise noted, expressions such as "first, second, A, B, (a), and (b)" and the like are expressions for differentiating elements, and the essence, sequence, order, number, or the like of the corresponding element is not limited by the expression.

In the present specification, each member and each element may be singular or plural, unless the context clarifies whether a member or element is "singular" or "plural".

In the present specification, unless otherwise noted, the expression "A includes B" does not necessarily mean that A consists of B and possibly means that A may consist of element other than B.

Unless otherwise noted, "cross section" in the present specification means a surface that appears at the time of cutting the light emitting device in a direction in which pixels, light emitting materials, or the like are laminated.

In the present specification, the expressions "not have", "not include", "not positioned", and the like may mean that a certain element is completely excluded, or may mean that an element is present to the extent that it does not have a technical effect.

In the present specification, expressions that describe anteroposterior relations in time such as "after", "subsequent to", "next", and "before" indicate relative time relations, and individual elements for which an anteroposterior relation in time is used are not necessarily continuous from each other. In the case of expressing individual elements that are continuous from each other, an expression "immediately", "directly", or the like may be used.

In the present specification, the expression "substantially parallel" also includes a state of being inclined to the extent that it has a technical effect, unless otherwise noted. For example, when the two elements A and B are positioned at an angle of equal to or more than −10° and equal to or less than 10° and have no critical technical effect at an angle of equal to or more than −10° and equal to or less than 10°, it is expressed as "A and B are substantially parallel". A state where two elements A and B are positioned at an angle of equal to or more than −10° and equal to or less than 10° due to a manufacturing error is also expressed as "substantially parallel". The expression "parallel" means that two elements are mathematically parallel.

Unless otherwise noted, the expression "A covers B" in the present specification may mean, for example, that A contacts with B with no other elements (for example, a layer) positioned between A and B or may mean that other elements (for example, a layer) are partially or fully positioned between A and B.

In the following, embodiments of the present invention will be described below with reference to the drawings. In all drawings, similar components are designated by the similar reference numerals, and the description thereof will not be repeated.

Embodiment 1

Figure 2:
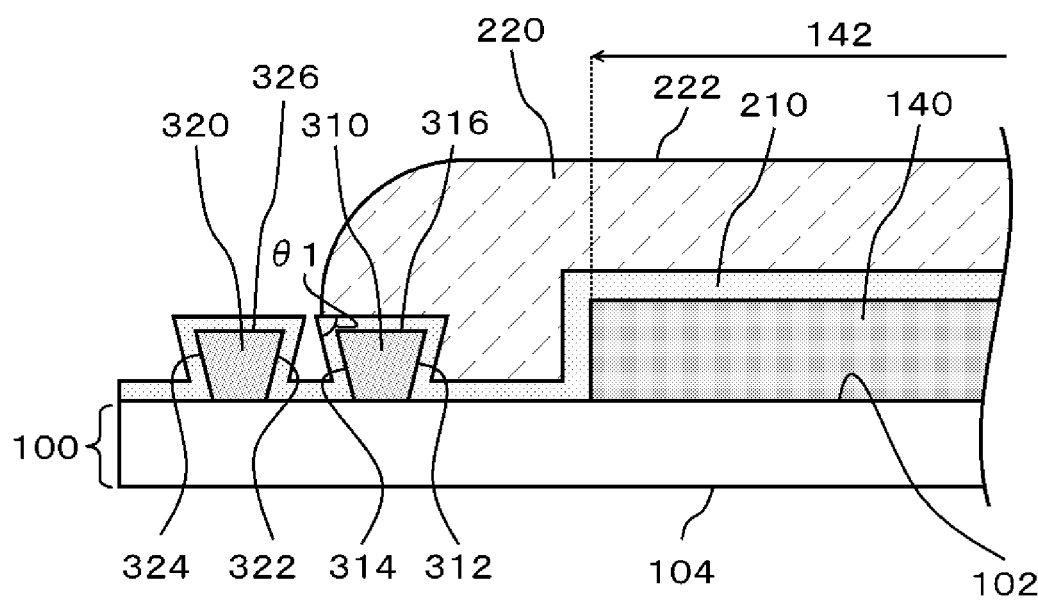
FIG. 2 is a cross-sectional view taken along line A-A of FIG. 1.

FIG. 1 is a plan view of a light emitting device 10 according to Embodiment 1. FIG. 2 is a cross-sectional view taken along line A-A of FIG. 1. In FIG. 1, a A-A direction is a direction perpendicular to an extension direction of a first structure 310 or a second structure 320 extending along an outer edge on a left side of a light emitting portion 140 (light emitting region 142) in FIG. 1. For the sake of description, a sealing layer 210 (FIG. 2) is not shown in FIG. 1.

The light emitting device 10 includes a substrate 100, the light emitting portion 140 (light emitting region 142), the sealing layer 210, a resin layer 220, the first structure 310, the second structure 320.

The substrate 100 may be a single layer or a plurality of layers. A thickness of the substrate 100 is, for example, equal to or more than 10 μm and equal to or less than 1000 μm. The substrate 100 has a first surface 102 and a second surface 104. The light emitting portion 140, the sealing layer 210, the resin layer 220, the first structure 310, and the second structure 320 are positioned over the first surface 102 of the substrate 100. The second surface 104 is positioned opposite to the first surface 102. The substrate 100 is a glass substrate, for example. The substrate 100 may be a resin substrate containing an organic material (for example, polyethylene naphthalate (PEN), polyethersulfone (PES), polyethylene terephthalate (PET), or polyimide). When the substrate 100 is the resin substrate, an inorganic barrier layer (for example, SiN or SiON) may be positioned over at least one of the first surface 102 and the second surface 104 of the substrate 100.

In the present embodiment, the light emitting device 10 emits light from the second surface 104 side of the substrate 100. That is, the light emitting device 10 is a bottom emission. In this case, the substrate 100 has translucency. A transmittance of the visible light of the substrate 100 is, for example, equal to or more than 75% and equal to or less than 100%. The light emitting device 10, however, may emit the light from the first surface 102 side of the light emitting device 10. That is, the light emitting device 10 may be a top emission. Alternatively, the light emitting device 10 may emit the light from both the second surface 104 side and the first surface 102 side of the substrate 100.

The light emitting region 142 includes the light emitting portion 140. The light emitting region 142 is a region where the light is emitted by the light emitting portion 140. The light emitting portion 140 has an organic electroluminescence (EL) element. The organic EL element has an organic layer including an emissive layer. In the present embodiment, the light emitting portion 140 is a surface light source extending over the entire light emitting region 142. In other words, the light emitting device 10 is a light emitting panel. It should be noted that the shapes of the substrate 100 and the light emitting portion 140 (light emitting region 142) of the light emitting device 10 are not limited to the example (rectangle) shown in FIG. 1.

Figure 3:
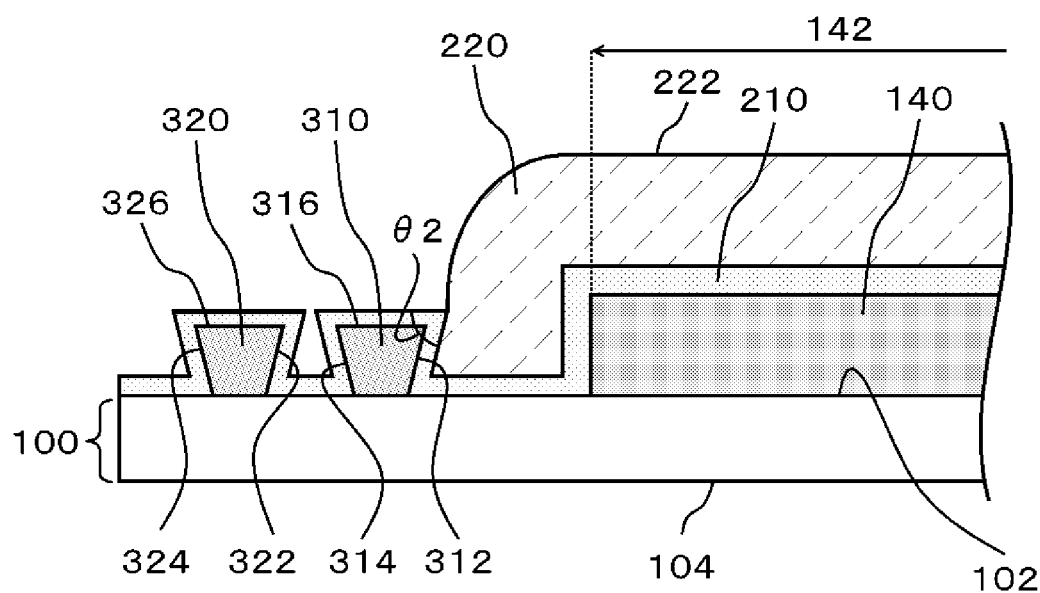
FIG. 3 is a view showing a modification example of FIG. 2.

The sealing layer 210 covers the first surface 102 of the substrate 100, the light emitting portion 140, the first structure 310, and the second structure 320. The sealing layer 210 includes one or a plurality of inorganic layers. The inorganic layer contains an inorganic material, such as at least one of silicon nitride ($SiN_x$), silicon oxide ($SiO_2$), silicon oxynitride (SiON), aluminum oxide ($Al_2O_3$), and titanium oxide ($TiO_2$). The sealing layer 210 is excellent in step coverage. Accordingly, as shown in FIG. 3, in one cross section, the sealing layer 210 extends along the unevenness formed by the light emitting portion 140, the first structure 310, and the second structure 320 over the first surface 102 of the substrate 100.

When viewed from a direction perpendicular to the first surface 102 of the substrate 100 (FIG. 1), the resin layer 220 covers at least a portion of the sealing layer 210 overlapping with the light emitting region 142 (portion covering the light emitting portion 140). When viewed from the direction perpendicular to the first surface 102 of the substrate 100 (FIG. 1), the resin layer 220 overlaps with a portion of the sealing layer 210 positioned outside the light emitting region 142, as well as the portion of the sealing layer 210 overlapping with the light emitting region 142. The resin layer 220 and the sealing layer 210 function as a sealing structure for sealing the light emitting portion 140. The resin layer 220 functions as a protective layer for protecting the light emitting portion 140 and the sealing layer 210. The resin layer 220 contains an acrylic resin, an epoxy resin, or a silicone resin, for example. An upper surface 222 of the resin layer 220 is substantially parallel to the first surface 102 of the substrate 100 at a region overlapping with the light emitting region 142 and its periphery. In other words, in the region overlapping with the light emitting region 142 and its periphery, a height of the upper surface 222 of the resin layer 220 with respect to the first surface 102 of the substrate 100 is substantially constant regardless of the position in the region and the periphery. In this case, when the light emitting device 10 is a light emitting device having translucency, the distortion of a transmitted image of the light emitting device 10 can be reduced. In order to make the upper surface 222 of the resin layer 220 substantially parallel to the first surface 102 of the substrate 100 in the region overlapping with the light emitting region 142 and its periphery, it is necessary to adjust the extending of the resin layer 220, that is, a position of an end portion of the resin layer 220 with high accuracy. In the present embodiment, as will be described below, the position of the end portion of the resin layer 220 can be adjusted with high accuracy by the first structure 310 or the second structure 320.

When viewed from the direction perpendicular to the first surface 102 of the substrate 100 (FIG. 1), the resin layer 220 overlaps with the light emitting region 142 and the first structure 310, and an outer end of the resin layer 220 extends along an outer end of the first structure 310 (second side surface 314 described below). The shape of the outer end of the resin layer 220, however, is not limited to the example shown in FIG. 1. For example, a part of the outer end of the resin layer 220 may extend along an inner end of the first structure 310 (first side surface 312 described below), an outer end of the second structure 320 (fourth side surface 324 described below), or an inner end of the second structure 320 (third side surface 322 described below). As will be described below, in the present embodiment, the position of the outer end of the resin layer 220 can be positioned between the inner end of the first structure 310 (first side surface 312 described below) or its periphery and the outer end of the second structure 320 (fourth side surface 324 described below) or its periphery.

When viewed from the direction perpendicular to the first surface 102 of the substrate 100 (FIG. 1), the first structure 310 continuously surrounds the light emitting region 142. In other words, the first structure 310 continuously extends along the outer edge of the light emitting region 142, and is not broken at any portion around the light emitting region 142. When viewed from the direction perpendicular to the first surface 102 of the substrate 100 (FIG. 1), the second structure 320 is positioned outside the first structure 310 with respect to the light emitting region 142, and continuously surrounds the light emitting region 142. In other words, the second structure 320 continuously extends along the outer edge of the first structure 310, and is not broken at any portion around the first structure 310.

In the cross section perpendicular to the substrate 100, specifically, in the cross section (for example, the cross section shown in FIG. 2) perpendicular to the first surface 102 of the substrate 100 and perpendicular to the extension direction of the first structure 310 or the second structure 320 (in FIG. 1, the direction in which the first structure 310 or the second structure 320 extends along the outer edge of the light emitting region 142), the first structure 310 has the first side surface 312, the second side surface 314, and a first upper surface 316. The first side surface 312 is positioned at the light emitting region 142 side. The first side surface 312 is inclined toward the light emitting region 142 with distance from the first surface 102 of the substrate 100. The second side surface 314 is positioned opposite to the first side surface 312. The second side surface 314 is inclined away from the light emitting region 142 with distance from the first surface 102 of the substrate 100. The first upper surface 316 is positioned between the first side surface 312 and the second side surface 314, and is substantially parallel to the first surface 102 of the substrate 100. In other words, the shape of the first structure 310 in one cross section (for example, the cross section shown in FIG. 2) is a trapezoid with a lower base (base in contact with the first surface 102 of the substrate 100) shorter than an upper base (base away from the first surface 102 of the substrate 100: the first upper surface 316).

In the cross section perpendicular to the substrate 100, specifically, in the cross section (for example, the cross section shown in FIG. 2) perpendicular to the first surface 102 of the substrate 100 and perpendicular to the extension direction of the first structure 310 or the second structure 320 (in FIG. 1, the direction in which the first structure 310 or the second structure 320 extends along the outer edge of the light emitting region 142), the second structure 320 has the third side surface 322, the fourth side surface 324, and a second upper surface 326. The third side surface 322 is positioned at the first structure 310 side. The third side surface 322 is inclined toward the first structure 310 with distance from the first surface 102 of the substrate 100. The fourth side surface 324 is positioned opposite to the third side surface 322. The fourth side surface 324 is inclined away from the first structure 310 with distance from the first surface 102 of the substrate 100. The second upper surface 326 is positioned between the third side surface 322 and the fourth side surface 324, and is substantially parallel to the first surface 102 of the substrate 100. In other words, the shape of the second structure 320 in one cross section (for example, the cross section shown in FIG. 2) is a trapezoid with a lower base (base in contact with the first surface 102 of the substrate 100) shorter than an upper base (base away from the first surface 102 of the substrate 100: the second upper surface 326).

The first structure 310 and the second structure 320 contain, for example, a resin, such as the acrylic resin, the epoxy resin, and the silicone resin. In other words, the first structure 310 and the second structure 320 may be made of the resin. The first structure 310 and the second structure 320 may contain the same material, or may contain different materials from each other. The first structure 310 and the second structure 320 have electrical insulation.

In the present embodiment, the position of the end portion of the resin layer 220 can be adjusted by the position of the first structure 310 or the second structure 320. The reason for this is as follows.

In the present embodiment, the sealing layer 210 is bent at an angle θ1 of an acute angle between the portion of the sealing layer 210 covering the first upper surface 316 of the first structure 310 and the portion of the sealing layer 210 covering the second side surface 314 of the first structure 310. The resin layer 220 is formed by curing an uncured resin layer having a relatively low viscosity. When the uncured resin layer is formed in the region surrounded by the first structure 310 and the uncured resin layer extends toward outside the light emitting portion 140 in a manufacturing process of the light emitting device 10, the uncured resin layer wetting and extending on the portion of the sealing layer 210 covering the first upper surface 316 of the first structure 310 is less likely to wet and extend on the portion of the sealing layer 210 covering the second side surface 314 of the first structure 310, as compared when the angle θ1 is a right angle or an obtuse angle. Accordingly, the position of the end portion of the resin layer 220 can be adjusted by the position of the first structure 310. Even if the end portion of the resin layer 220 extends to outside the first structure 310 with respect to the light emitting region 142, the second structure 320 has the same structure as the structure of the first structure 310. Accordingly, the position of the end portion of the resin layer 220 can be adjusted by the position of the second structure 320.

In the present embodiment, the upper surface 222 of the resin layer 220 over the light emitting portion 140 is positioned higher than the first upper surface 316 of the first structure 310 and the second upper surface 326 of the second structure 320 with respect to the first surface 102 of the substrate 100. In other words, the distance between the upper surface 222 of the resin layer 220 and the first surface 102 of the substrate 100 over the light emitting portion 140 in the direction perpendicular to the first surface 102 of the substrate 100 is larger than the distance between the first upper surface 316 of the first structure 310 and the first surface 102 of the substrate 100 in the direction perpendicular to the first surface 102 of the substrate 100 or the distance between the second upper surface 326 of the second structure 320 and the first surface 102 of the substrate 100 in the direction perpendicular to the first surface 102 of the substrate 100. In this case, when the uncured resin layer is formed in the region surrounded by the first structure 310 and the uncured resin layer extends toward outside the light emitting portion 140 in the manufacturing process of the light emitting device 10, the uncured resin layer easily covers the first upper surface 316 of the first structure 310 or the second upper surface 326 of the second structure 320. In the present embodiment, however, as described above, the position of the end portion of the resin layer 220 can be adjusted by the position of the first structure 310 or the second structure 320.

In the present embodiment, the position of the end portion of the resin layer 220 is adjusted by the shapes of the sealing layer 210 and the first structure 310 or the second structure 320. In other words, the position of the end portion of the resin layer 220 can be adjusted without surface treatment on the sealing layer 210 or the first structure 310 (for example, liquid repellent treatment). Thus, the manufacturing process of the light emitting device 10 is easy. The portion of the sealing layer 210 covering the first structure 310 or the second structure 320, however, may be treated with the liquid repellent.

Next, an example of the method of manufacturing the light emitting device 10 will be described.

First, the light emitting portion 140, the first structure 310, and the second structure 320 are formed over the first surface 102 of the substrate 100. The first structure 310 and the second structure 320 may be formed in a step of forming the light emitting portion 140, or may be formed before or after the step of forming the light emitting portion 140. In an example, the first structure 310 and the second structure 320 are formed by photolithography of resist to be the first structure 310 and the second structure 320. For example, exposure and development of a negative resist enables to leave the exposed portion of the resist as the first structure 310 and the second structure 320. In this case, the first structure 310 and the second structure 320 are formed by the same step. The steps of forming the first structure 310 and the step of forming the second structure 320, however, may be different from each other.

Next, the sealing layer 210 is formed over the first surface 102 of the substrate 100. The sealing layer 210 is formed by, for example, atomic layer deposition (ALD). The sealing layer 210, however, may be formed by a method different from the ALD, such as chemical vapor deposition (CVD) or sputtering.

Next, the resin layer 220 is formed over the first surface 102 of the substrate 100. Specifically, first, the uncured resin layer to be the resin layer 220 is formed in the region surrounded by the first structure 310. The uncured resin layer is formed by, for example, an application process such as inkjet or a deposition process such as vapor deposition. The uncured resin layer has a relatively low viscosity. Accordingly, the uncured resin layer easily extends over the first surface 102 of the substrate 100. In the present embodiment, however, the extending of the uncured resin layer can be limited by the first structure 310 or the second structure 320. That is, the position of the end portion of the uncured resin layer can be adjusted by the position of the first structure 310 or the second structure 320. Next, the uncured resin layer is cured to form the uncured resin layer on the resin layer 220. For example, photo-curing or thermosetting is used for curing the uncured resin layer.

Thus, the light emitting device 10 is manufactured.

In the present embodiment, the light emitting device 10 includes two structures (first structure 310 and second structure 320). The number of structures in the light emitting device 10, however, may be only one. Alternatively, the light emitting device 10 may include three or more structures.

In the present embodiment, the first side surface 312 of the first structure 310 is inclined toward the light emitting region 142 side (right side in FIG. 2) with respect to the direction perpendicular to the first surface 102 of the substrate 100 (vertical direction in FIG. 2). The first side surface 312 of the first structure 310, however, may be along the direction perpendicular to the first surface 102 of the substrate 100 (vertical direction in FIG. 2), or may be inclined toward opposite (left side in FIG. 2) to the light emitting region 142 with respect to the direction perpendicular to the first surface 102 of the substrate 100. Similarly, the third side surface 322 of the second structure 320 may be along the direction perpendicular to the first surface 102 of the substrate 100 (vertical direction in FIG. 2), or may be inclined toward opposite (left side in FIG. 2) to the light emitting region 142 with respect to the direction perpendicular to the first surface 102 of the substrate 100.

In the present embodiment, the light emitting portion 140 includes the organic EL element. The light emitting portion 140, however, may have a light emitting portion different from the organic EL element, such as an inorganic EL element or a semiconductor LED (light-emitting diode).

FIG. 3 is a view showing a modification example of FIG. 2. The example shown in FIG. 3 is the same as the example shown in FIG. 2 except for the position of the end portion of the resin layer 220. Also in the present modification example, the position of the end portion of the resin layer 220 can be adjusted by the position of the first structure 310 or the second structure 320. The reason for this is as follows.

In the present modification example, the sealing layer 210 is bent at an angle θ2 of an acute angle between the portion of the sealing layer 210 covering the first side surface 312 of the first structure 310 and the portion of the sealing layer 210 covering the first upper surface 316 of the first structure 310. The resin layer 220 is formed by curing an uncured resin layer having a relatively low viscosity. When the uncured resin layer is formed in the region surrounded by the first structure 310 and the uncured resin layer extends toward outside the light emitting portion 140 in a manufacturing process of the light emitting device 10, the uncured resin layer wetting and extending on the portion of the sealing layer 210 covering the first side surface 312 of the first structure 310 is less likely to wet and extend on the portion of the sealing layer 210 covering the first upper surface 316 of the first structure 310, as compared with when the angle θ2 is a right angle or an obtuse angle. Accordingly, the position of the end portion of the resin layer 220 can be adjusted by the position of the first structure 310. Even if the end portion of the resin layer 220 extends to outside the first structure 310 with respect to the light emitting region 142, the second structure 320 has the same structure as the structure of the first structure 310. Accordingly, the position of the end portion of the resin layer 220 can be adjusted by the position of the second structure 320.

In the present modification example, the second side surface 314 of the first structure 310 is inclined toward opposite to the light emitting region 142 (left side in FIG. 2) with respect to the direction perpendicular to the first surface 102 of the substrate 100 (vertical direction in FIG. 3). The second side surface 314 of the first structure 310, however, may be along the direction perpendicular to the first surface 102 of the substrate 100 (vertical direction in FIG. 3), or may be inclined toward the light emitting region 142 side (right side in FIG. 3) with respect to the direction perpendicular to the first surface 102 of the substrate 100. Similarly, the fourth side surface 324 of the second structure 320 may be along the direction perpendicular to the first surface 102 of the substrate 100 (vertical direction in FIG. 3), or may be inclined toward the light emitting region 142 side (right side in FIG. 3) with respect to the direction perpendicular to the first surface 102 of the substrate 100.

Figure 4:
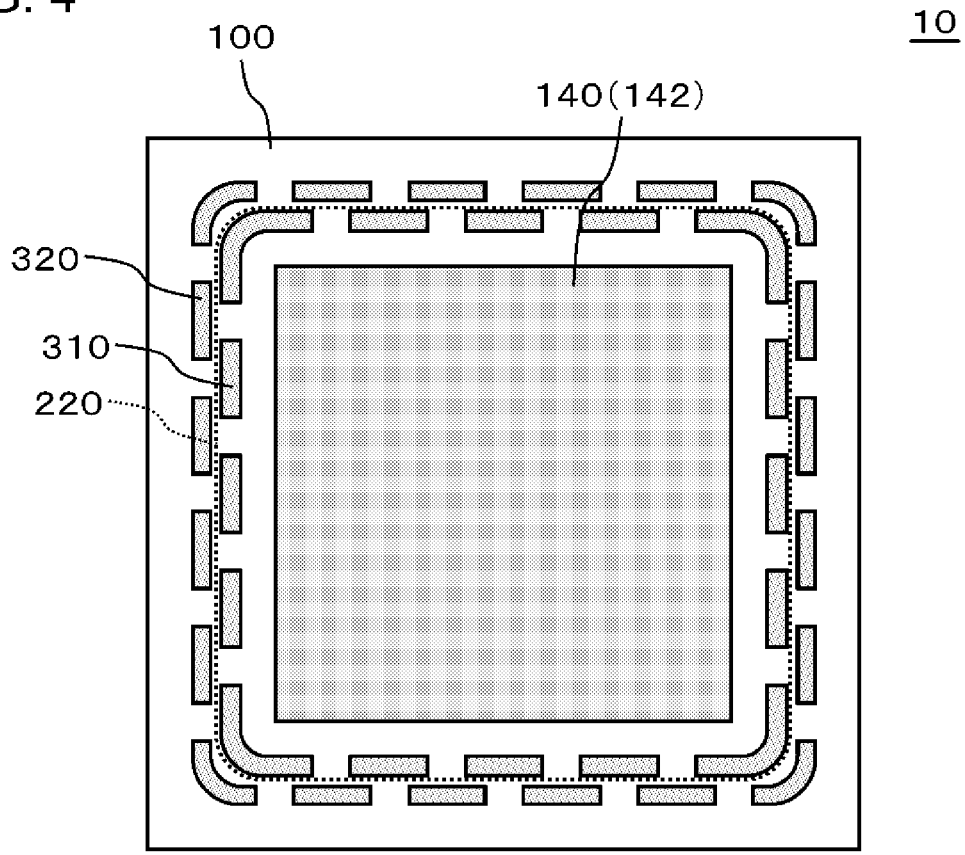
FIG. 4 is a view showing a modification example of FIG. 1.

FIG. 4 is a view showing a modification example of FIG. 1.

When viewed from the direction perpendicular to the first surface 102 of the substrate 100 (FIG. 4), the first structure 310 discontinuously surrounds the light emitting region 142. In other words, the first structure 310 discontinuously extends along the outer edge of the light emitting region 142, and is broken at least one portion around the light emitting region 142. When viewed from the direction perpendicular to the first surface 102 of the substrate 100 (FIG. 4), the second structure 320 is positioned outside the first structure 310 with respect to the light emitting region 142, and discontinuously surrounds the light emitting region 142. In other words, the second structure 320 discontinuously extends along the outer edge of the first structure 310, and is broken at least one portion around the first structure 310.

A plurality of portions of the first structure 310 spaced apart from each other along the outer edge of the light emitting region 142 and a plurality of portions of the second structure 320 spaced apart from each other along the outer edge of the light emitting region 142 are alternately arranged along the outer edge of the light emitting region 142. Accordingly, even if a part of the resin layer 220 extends toward outside the light emitting region 142 from the region between adjacent portions of the first structure 310 along the outer edge of the light emitting region 142, the extension of a part of the resin layer 220 can be limited by the second structure 320. The plurality of portions of the first structure 310 spaced apart from each other along the outer edge of the light emitting region 142 and the plurality of portions of the second structure 320 spaced apart from each other along the outer edge of the light emitting region 142, however, may be aligned along the outer edge of the light emitting region 142.

Embodiment 2

Figure 5:
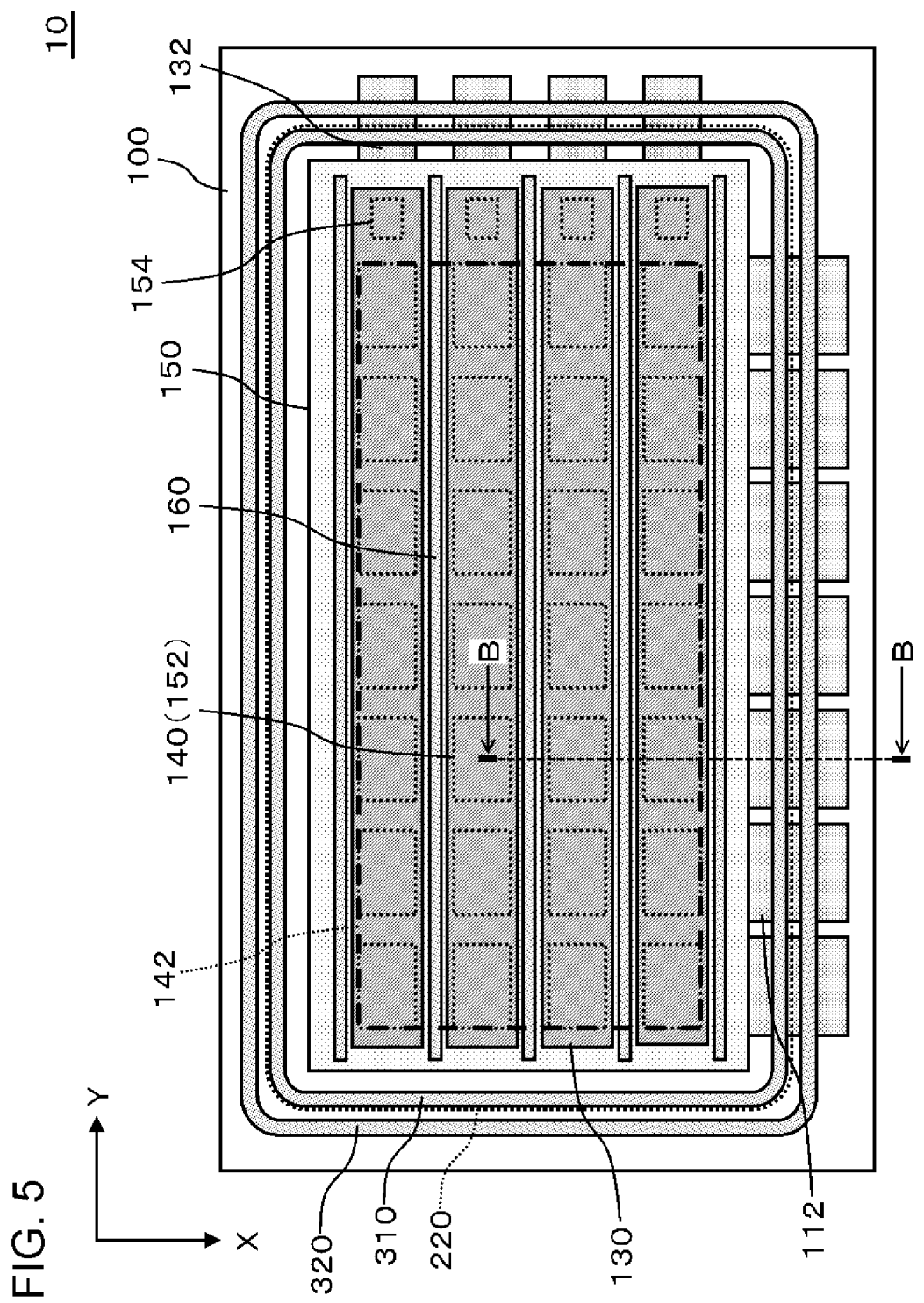
FIG. 5 is a plan view of a light emitting device according to Embodiment 2.
Figure 6:
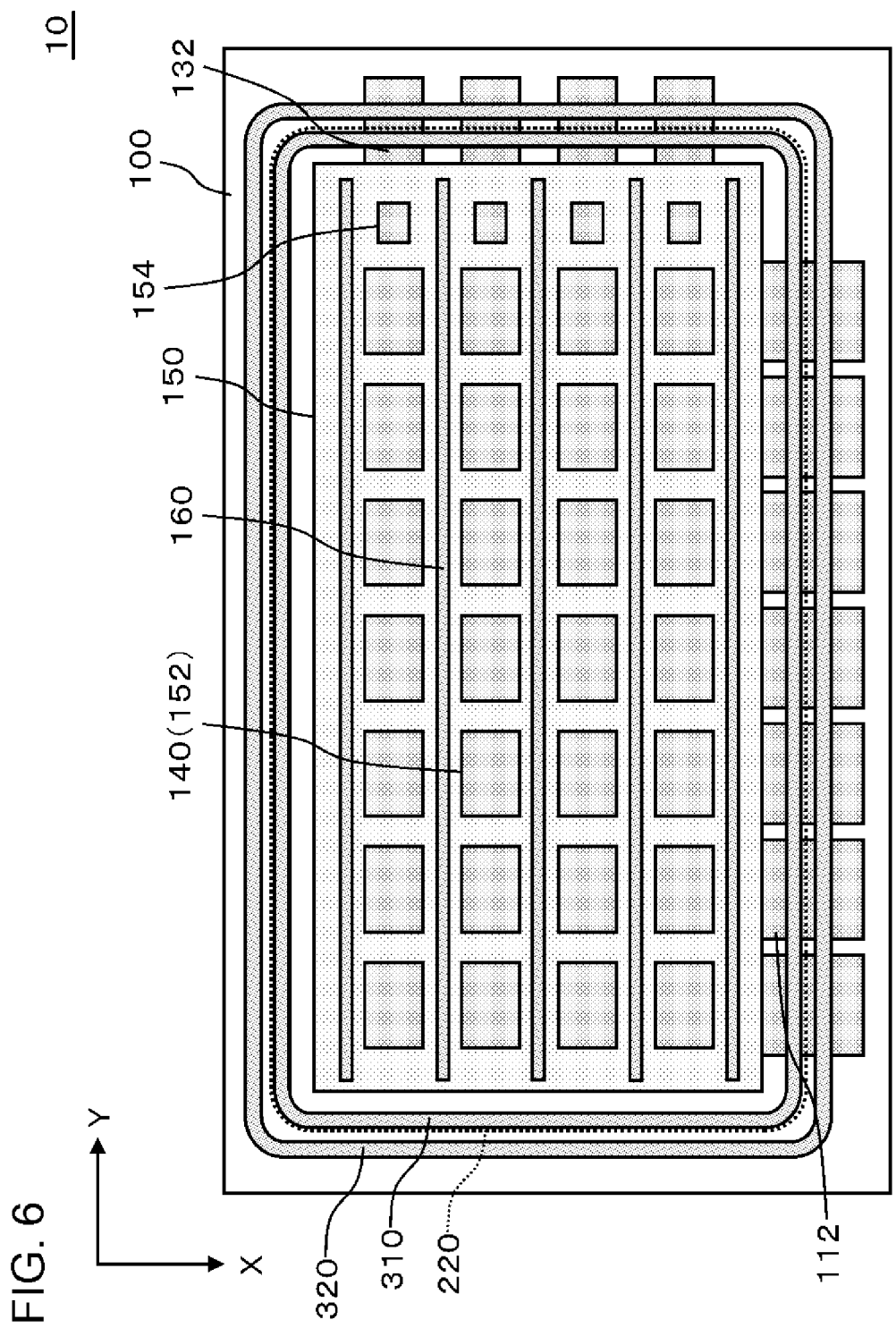
FIG. 6 is a view with a plurality of second electrodes removed from FIG. 5.
Figure 7:
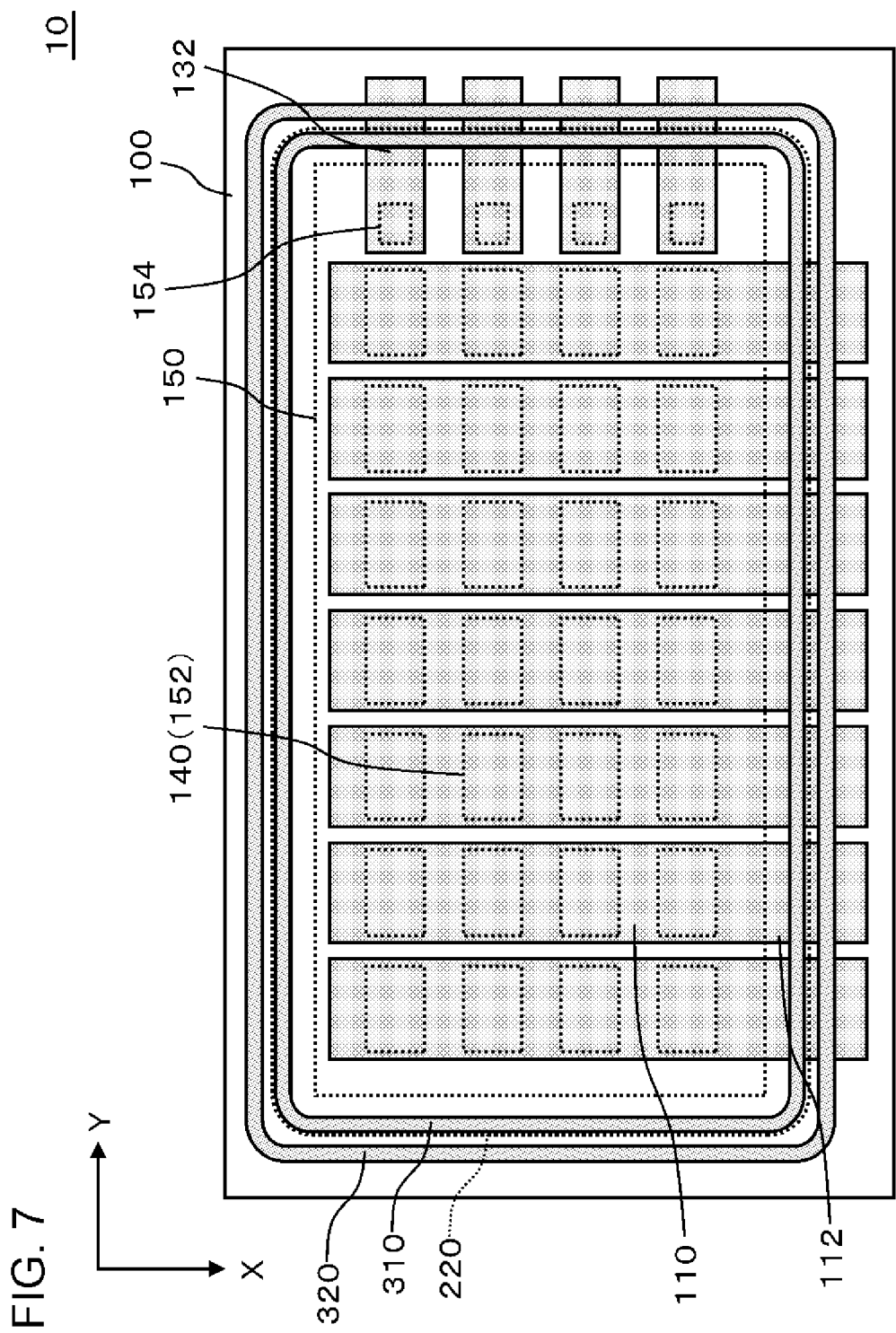
FIG. 7 is a view with an insulating layer and a plurality of partition walls removed from FIG. 6.
Figure 8:
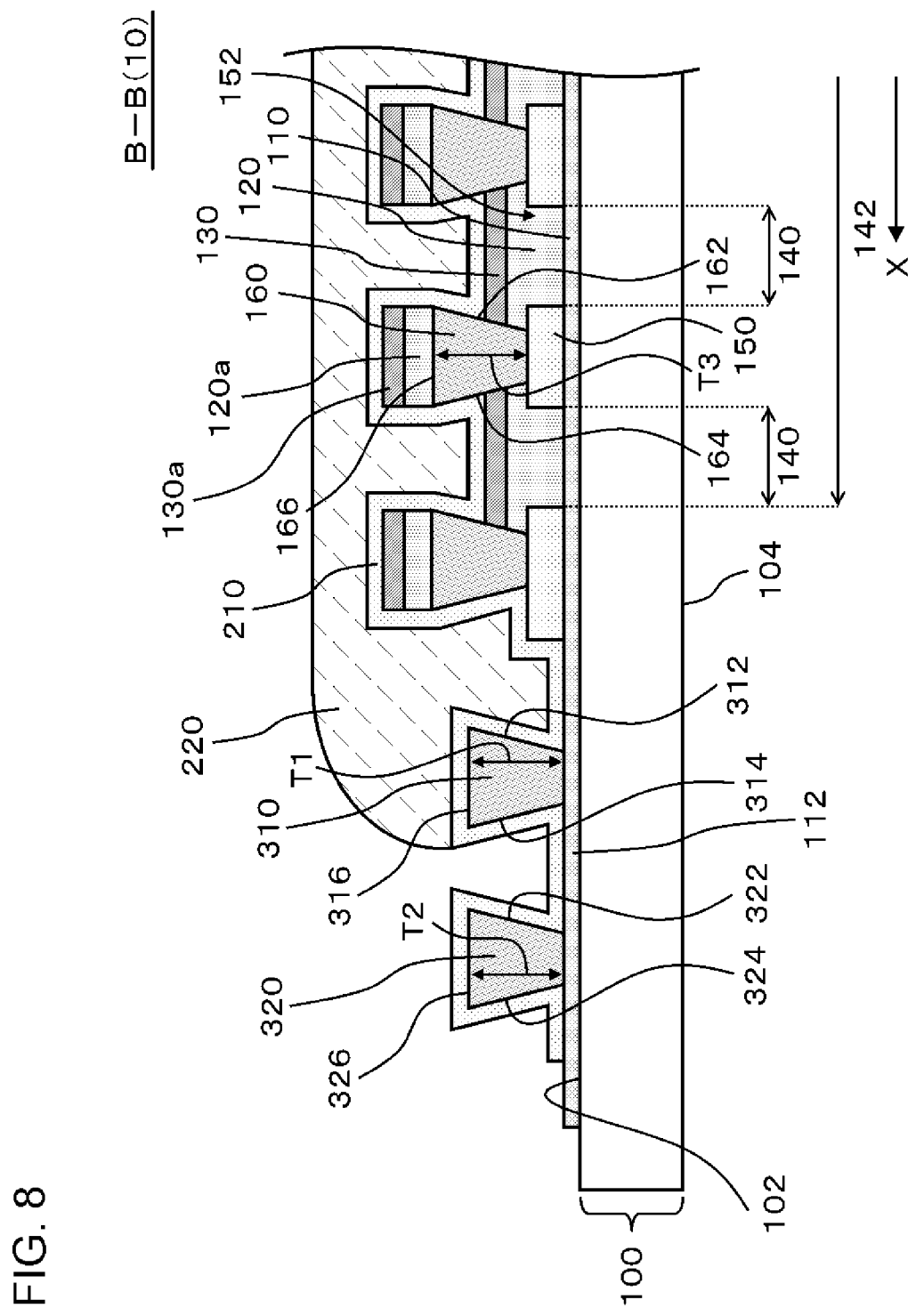
FIG. 8 is a cross-sectional view taken along line B-B of FIG. 5.

FIG. 5 is a plan view of the light emitting device 10 according to Embodiment 2. FIG. 6 is a view with a plurality of second electrodes 130 removed from FIG. 5. FIG. 7 is a view with an insulating layer 150 and a plurality of partition walls 160 removed from FIG. 6. FIG. 8 is a cross-sectional view taken along line B-B of FIG. 5. In FIGS. 5 to 8, an X direction indicates an extension direction of each first electrode 110 (longitudinal direction of each first electrode 110), and a Y direction indicates a direction intersecting the X direction, specifically, a direction orthogonal to the X direction, and indicates an extension direction of each second electrode 130 (longitudinal direction of each second electrode 130). In FIG. 5, the B-B direction is along the X direction. For the sake of description, FIGS. 5 to 7 do not show the organic layer 120 and the sealing layer 210 (FIG. 8). The light emitting device 10 according to Embodiment 2 is the same as the light emitting device 10 according to Embodiment 1 except the following points.

The light emitting device 10 includes a substrate 100, a plurality of first electrodes 110, a plurality of first wires 112, a plurality of organic layers 120, the plurality of second electrodes 130, a plurality of second wires 132, an insulating layer 150, the plurality of partition walls 160, the sealing layer 210, the resin layer 220, the first structure 310, and the second structure 320.

The light emitting device 10 is a light emitting display. Specifically, the light emitting device 10 includes a plurality of light emitting portions 140 arranged in a matrix along the X direction and the Y direction. In the example shown in FIGS. 5 to 7, the plurality of light emitting portions 140 are arranged in four rows in the X direction and seven columns in the Y direction. The layouts of the plurality of light emitting portions 140, however, are not limited to the examples shown in FIGS. 5 to 7. Each light emitting portion 140 is a pixel of the light emitting display.

The light emitting region 142 of the light emitting device 10 includes the plurality of light emitting portions 140. The light emitting region 142 is defined as follows. A shape of the light emitting region 142 is a rectangle having two sides extending along the X direction and two sides extending along the Y direction. The two sides of the light emitting region 142 extending along the X direction overlap with one side of the light emitting portion 140 positioned at the outermost side in the Y direction (one side at the outer side in the Y direction of two sides of the light emitting portion 140 extending along the X direction) among the plurality of light emitting portions 140. The two sides of the light emitting region 142 extending along the Y direction overlap with one side of the light emitting portion 140 positioned at the outermost side in the X direction (one side at the outer side in the X direction of two sides of the light emitting portion 140 extending along the Y direction) among the plurality of light emitting portions 140.

In the present embodiment, the light emitting device 10 emits light from the second surface 104 side of the substrate 100. That is, the light emitting device 10 is a bottom emission. The light emitting device 10, however, may emit the light from the first surface 102 side of the light emitting device 10. That is, the light emitting device 10 may be a top emission. Alternatively, the light emitting device 10 may emit the light from both the second surface 104 side and the first surface 102 side of the substrate 100.

The plurality of first electrodes 110 are positioned over the first surface 102 of the substrate 100. The plurality of first electrodes 110 extend along the X direction, and are arranged along the Y direction. Each first electrode 110 has translucency. A transmittance of the visible light of each first electrode 110 is, for example, equal to or more than 75% and equal to or less than 100%. Each first electrode 110 can function as the anode. In an example, the first electrode 110 contains an oxide semiconductor. Examples of the oxide semiconductor include indium tin oxide (ITO), indium zinc oxide (IZO), indium tungsten zinc oxide (IWZO), zinc oxide (ZnO), and indium gallium zinc oxide (IGZO).

The plurality of organic layers 120 are positioned over the first surface 102 of the substrate 100 and over the plurality of first electrodes 110 to intersect the plurality of first electrodes 110. The plurality of organic layers 120 extend along the Y direction, and are arranged along the X direction. Each organic layer 120 may include, for example, a hole injection layer (HIL), a hole transport layer (HTL), an emissive layer (EML), an electron transport layer (ETL), and an electron injection layer (EIL) in order from the first electrode 110 to the second electrode 130. Examples of the layers included in each organic layer 120, however, are not limited to the example described here.

The plurality of second electrodes 130 are positioned over the first surface 102 of the substrate 100, over the plurality of first electrodes 110, and over the plurality of organic layers 120 to intersect the plurality of first electrodes 110. The plurality of second electrodes 130 extend along the Y direction, and are arranged along the X direction. Each second electrode 130 can function as the cathode. In an example, each second electrode 130 may contain metal or alloy. The metal or alloy is, for example, at least one metal selected from the group consisting of Al, Au, Ag, Pt, Mg, Sn, Zn, and In, or an alloy of the metal selected from the group described above.

The insulating layer 150 has a plurality of first openings 152. The insulating layer 150 contains, for example, an organic insulating material, such as polyimide. The insulating layer 150 is positioned over the first surface 102 of the substrate 100 and over the plurality of first electrodes 110 such that a part of each of the plurality of first electrodes 110 is exposed from each first opening 152. Each of the plurality of first openings 152 defines each of the plurality of light emitting portions 140. Specifically, in each first opening 152, a part of each first electrode 110, a part of each organic layer 120, and a part of each second electrode 130 are arranged in order from the first surface 102 of the substrate 100, and overlap with each other. In other words, each light emitting portion 140 has a portion of each first electrode 110 overlapping with the first opening 152, a portion of each organic layer 120 overlapping with the first opening 152, and a portion of each second electrode 130 overlapping with the first opening 152.

Each of the plurality of first electrodes 110 is connected to each of the plurality of first wires 112. In the present embodiment, each first electrode 110 and each first wire 112 are a common conductive layer. Each first wire 112 is, for example, a portion of the common conductive layer outside the outer edge of the insulating layer 150. Each first electrode 110 and each first wire 112, however, may be different conductive layers. A part of the first wires 112 is positioned outside the first structure 310 and the second structure 320 with respect to the light emitting region 142. Accordingly, the voltage can be supplied to the first electrode 110 from the outside of the light emitting device 10 through the first wire 112.

Each of the plurality of second electrodes 130 is connected to each of the plurality of second wires 132. Each second wire 132 contains the material described for the first electrode 110, for example. One end portion of each second wire 132 is covered with the insulating layer 150. The insulating layer 150 has a plurality of second openings 154. A part of the one end portion of each second wire 132 is exposed from each second opening 154 of the insulating layer 150, and is in contact with each second electrode 130. The other end portion of the second wire 132 is positioned outside the first structure 310 and the second structure 320 with respect to the light emitting region 142. Accordingly, the voltage can be supplied to the second electrode 130 from the outside of the light emitting device 10 through the second wire 132.

The plurality of partition walls 160 are positioned over the insulating layer 150. The plurality of partition walls 160 extend along the Y direction, and are arranged alternately with the plurality of second electrodes 130 along the X direction. In other words, each partition wall 160 is positioned between adjacent second electrodes 130. The partition wall 160 contains, for example, a resin, such as an acrylic resin, an epoxy resin, or a silicone resin. In other words, the partition wall 160 may be a resin body.

In the cross section perpendicular to the substrate 100, specifically, in the cross section perpendicular to the first surface 102 of the substrate 100 and perpendicular to the extension direction (Y direction) of the partition wall 160 (for example, the cross section shown in FIG. 8), the partition wall 160 has a fifth side surface 162, a sixth side surface 164, and a third upper surface 166. The fifth side surface 162 and the sixth side surface 164 are opposite to each other. The fifth side surface 162 is inclined away from the sixth side surface 164 with distance from the first surface 102 of the substrate 100. The sixth side surface 164 is inclined away from the fifth side surface 162 with distance from the first surface 102 of the substrate 100. The third upper surface 166 is positioned between the fifth side surface 162 and the sixth side surface 164, and is substantially parallel to the first surface 102 of the substrate 100.

A height T3 of the partition wall 160 (length of the partition wall 160 in the direction perpendicular to the first surface 102 of the substrate 100) is substantially equal to a height T1 of the first structure 310 (length of the first structure 310 in the direction perpendicular to the first surface 102 of the substrate 100) or a height T2 of the second structure 320 (length of the second structure 320 in the direction perpendicular to the first surface 102 of the substrate 100). For example, the height T3 of the partition wall 160 is equal to or more than 90% and equal to or less than 110% of the height T1 of the first structure 310, or is equal to or more than 90% and equal to or less than 100% of the height T2 of the second structure 320. The height T3 of the partition wall 160, however, may be different from the height T1 of the first structure 310 or the height T2 of the second structure 320.

An organic layer 120a and a conductive layer 130a are positioned over the third upper surface 166 of the partition wall 160. The organic layer 120a contains the same material as the organic layer 120, and the conductive layer 130a contains the same material as the second electrode 130.

The sealing layer 210 covers a first surface 102 of the substrate 100, the plurality of first electrodes no, the plurality of second electrodes 130, the insulating layer 150, the partition wall 160 (including the organic layer 120a and the conductive layer 130a over the third upper surface 166 of the partition wall 160), the first structure 310, and the second structure 320. The sealing layer 210 is excellent in step coverage. Accordingly, as shown in FIG. 8, in one cross section, the sealing layer 210 extends along the unevenness formed by the light emitting portion 140, the insulating layer 150, the partition wall 160 (including the organic layer 120a and the conductive layer 130a over the third upper surface 166 of the partition wall 160), the first structure 310, and the second structure 320 over the first surface 102 of the substrate 100.

The resin layer 220 covers the sealing layer 210 in the light emitting region 142 in the same manner as in Embodiment 1. Also in the present embodiment, the position of the end portion of the resin layer 220 can be adjusted by the position of the first structure 310 or the second structure 320 in the same manner as in Embodiment 1.

Next, an example of the method of manufacturing the light emitting device 10 will be described.

First, the plurality of first electrodes 110 (including the plurality of first wires 112) and the plurality of second wires 132 are formed over the first surface 102 of the substrate 100. The plurality of first electrodes 110 and the plurality of second wires 132 are formed, for example, by patterning the conductive layer. When the plurality of first electrodes 110, the plurality of first wires 112, and the plurality of second wires 132 are formed from a common conductive layer, the plurality of first electrodes 110, the plurality of first wires 112, and the plurality of second wires 132 contain the same material.

Next, an insulating layer to be the insulating layer 150 is formed over the first surface 102 of the substrate 100, and the insulating layer is exposed and developed to form the insulating layer 150, the plurality of first openings 152, and the plurality of second openings 154.

Next, the plurality of partition walls 160, the first structure 310, and the second structure 320 are formed over the first surface 102 of the substrate 100 and over the insulating layer 150. Specifically, each partition wall 160, the first structure 310, and the second structure 320 are formed by photolithography of resist to be each partition wall 160, the first structure 310, and the second structure 320. For example, exposure and development of a negative resist enables to leave the exposed portion of the resist as each partition wall 160, the first structure 310, and the second structure 320. In this case, the plurality of partition walls 160, the first structure 310, and the second structure 320 are formed by the same step. Accordingly, the manufacturing process of the light emitting device 10 can be simplified. In this case, the plurality of partition walls 160, the first structure 310, and the second structure 320 contain the same material (for example, the same resin). The height T3 of the partition wall 160 is almost equal to the height T1 of the first structure 310 or the height T2 of the second structure 320. A step of forming the plurality of partition walls 160 and a step of forming the first structure 310 or the second structure 320, however, may be different steps. The material contained in each partition wall 160 and the material contained in the first structure 310 or the second structure 320 may be different from each other.

Next, an organic layer to be the organic layer 120 is formed over the first surface 102 of the substrate 100 by vapor deposition. In this case, the organic layer is divided from each other by each partition wall 160 to form the plurality of organic layers 120, and the organic layer 120a remains over each partition wall 160. The organic layer 120, however, may be formed by a method different from vapor deposition, such as a coating process such as inkjet. In this case, the organic layer is not divided by the plurality of partition walls 160, and the organic layer 120a does not remain over each partition wall 160.

Next, a conductive layer to be the second electrode 130 is formed over the first surface 102 of the substrate 100 by vapor deposition. In this case, the conductive layer is divided from each other by each partition wall 160 to form the plurality of second electrodes 130, and the conductive layer 130a remains over each partition wall 160.

Next, the sealing layer 210 is formed over the substrate 100. A forming method of the sealing layer 210 is the same as the method described in Embodiment 1.

Next, the resin layer 220 is formed over the first surface 102 of the substrate 100. A forming method of the resin layer 220 is the same as the method described in Embodiment 1.

Thus, the light emitting device 10 is manufactured.

Embodiment 3

FIGS. 9 to 12 are cross-sectional views for describing an example of the manufacturing method of the light emitting device 10 according to Embodiment 3. The light emitting device 10 according to Embodiment 3 is different from the light emitting device 10 according to Embodiment 1 or Embodiment 2 except the following points.

Figure 9:
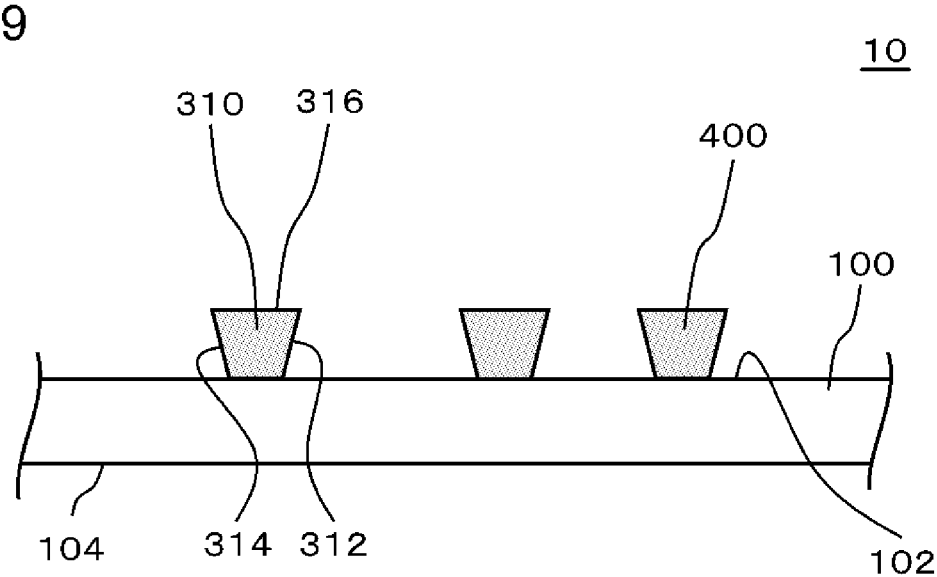
FIG. 9 is a cross-sectional view for describing an example of a method of manufacturing a light emitting device according to Embodiment 3.

First, as shown in FIG. 9, the first structure 310 and two adjacent resist films 400 are formed over the first surface 102 of the substrate 100. In the example shown in FIG. 9, the first structure 310 and each resist film 400 extend along the direction perpendicular to the paper, for example, in the same manner as the first structure 310 shown in FIG. 2. In an example, the first structure 310 and each resist film 400 are formed by photolithography of resist to be the first structure 310 and each resist film 400. For example, exposure and development of a negative resist enables to leave the exposed portion of the resist as the first structure 310 and each resist film 400. In this case, the first structure 310 and each resist film 400 are formed by the same step. In this case, the first structure 310 and each resist film 400 contain the same material. The step of forming the first structure 310 and a step of forming each resist film 400, however, may be different steps.

Figure 10:
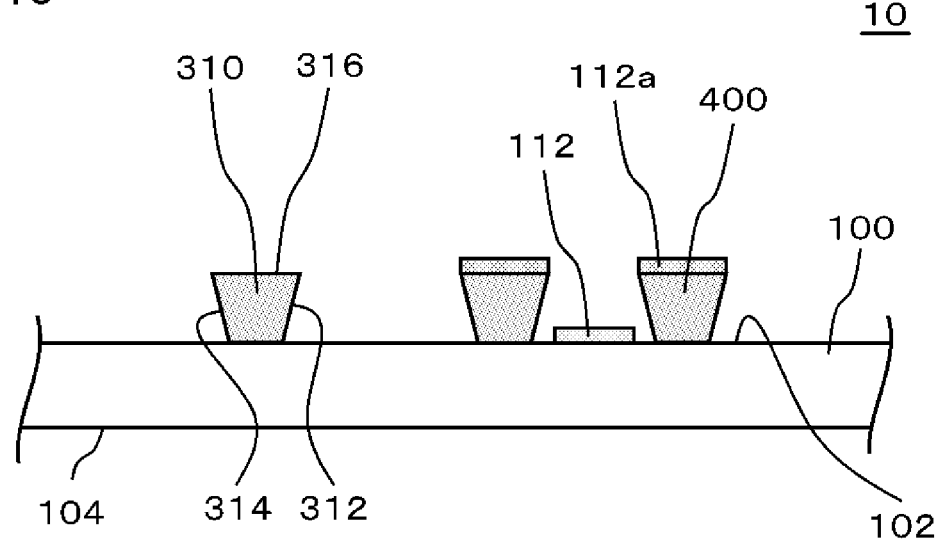
FIG. 10 is a cross-sectional view for describing an example of the method of manufacturing the light emitting device according to Embodiment 3.

Next, as shown in FIG. 10, the conductive layer to be the first wire 112 and a conductive layer 112a (conductive layer 112a will be described below) is deposited over the two adjacent resist films 400 and over the portion of the first surface 102 of the substrate 100 positioned between the two adjacent resist films 400. The conductive layer is deposited, for example, by vapor deposition. With the resist film 400, the conductive layer is separated into the conductive layer (first wire 112) over the portion of the first surface 102 of the substrate 100 positioned between the two adjacent resist films 400, and the conductive layer (conductive layer 112a) over each of the two adjacent resist films 400.

Figure 11:
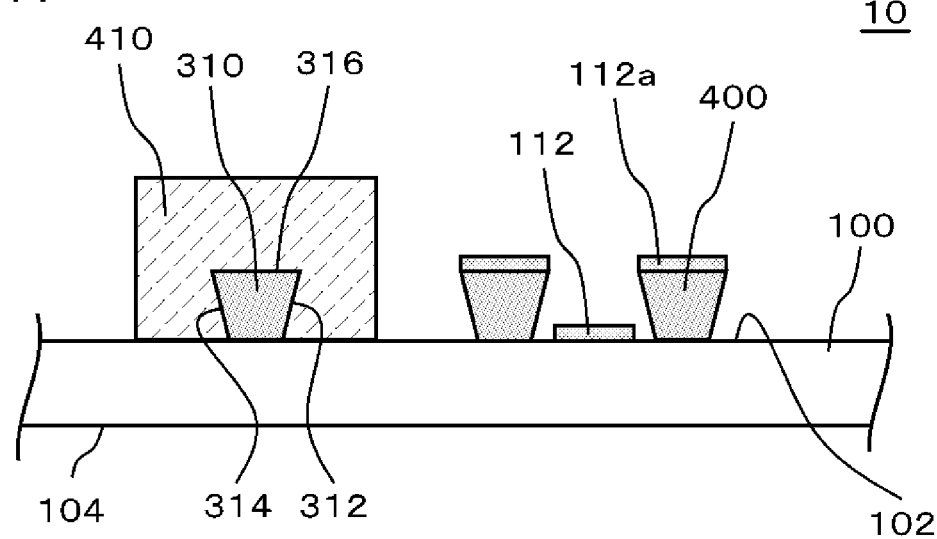
FIG. 11 is a cross-sectional view for describing an example of the method of manufacturing the light emitting device according to Embodiment 3.

Next, as shown in FIG. 11, the first structure 310 is covered with a protective layer 410, whereas the two adjacent resist films 400 are not covered with the protective layer 410. The protective layer 410 is, for example, a resist containing a material different from the materials contained in the first structure 310 and the resist film 400.

Figure 12:
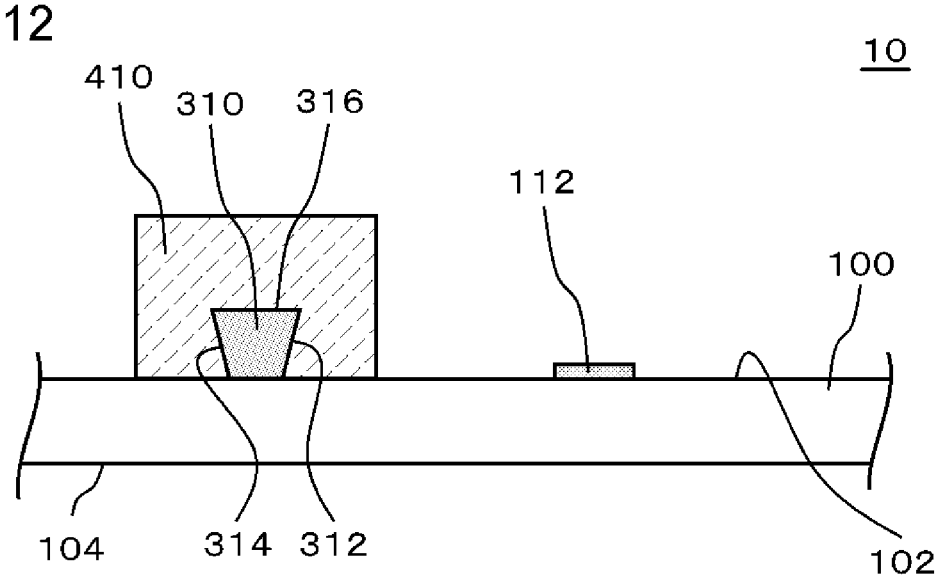
FIG. 12 is a cross-sectional view for describing an example of the method of manufacturing the light emitting device according to Embodiment 3.

Next, as shown in FIG. 12, the resist film 400 is removed from the first surface 102 of the substrate 100 together with the conductive layer 112a while leaving the first structure 310 over the first surface 102 of the substrate 100. In other words, the resist film 400 is lifted off. Specifically, the resist film 400 can be removed by a solvent that dissolves the resist film 400. In this case, even if the first structure 310 and the resist film 400 contain the same material, the first structure 310 is protected from the solvent by the protective layer 410. Thus, the first wire 112 can be patterned while forming the first structure 310 over the first surface 102 of the substrate 100.

Next, the protective layer 410 is removed from the first surface 102 of the substrate 100.

In the present embodiment, the light emitting portion 140 (light emitting region 142) is formed over the first surface 102 of the substrate 100 before or after the steps shown in FIGS. 9 to 12 or in the steps shown in FIGS. 9 to 12. After the light emitting portion 140 and the first structure 310 are formed, the sealing layer 210 and the resin layer 220 are formed in the same manner as in Embodiments 1 and 2. The first structure 310 surrounds the light emitting region 142 when viewed from the direction perpendicular to the first surface 102 of the substrate 100. When viewed from the direction perpendicular to the first surface 102 of the substrate 100, the first wire 112 may be positioned between the light emitting region 142 and the first structure 310, or may be positioned outside the first structure 310 with respect to the light emitting region 142. Also in the present embodiment, the position of the end portion of the resin layer 220 can be adjusted by the position of the first structure 310.

In the present embodiment, the first wire 112 is patterned by the lift-off of the resist film 400. The conductive layer patterned by the lift-off of the resist film 400, however, may be a conductive layer different from the first wire 112, or may be, for example, the second wire 132.

In the above, the embodiments have been described above with reference to the drawings, these are examples of the present invention, and various configurations other than the above can be adopted.

This application claims priority based on Japanese Patent Application No. 2019-165939 filed on Sep. 12, 2019, the entire disclosure of which is incorporated herein by reference.

REFERENCE SIGNS LIST

10: light emitting device
100: substrate
102: first surface
104: second surface
110: first electrode
112: first wire
120: organic layer
120a: organic layer
130: second electrode
130a: conductive layer
132: second wire
140: light emitting portion
142: light emitting region
150: insulating layer
152: first opening
154: second opening
160: partition wall
162: fifth side surface
164: sixth side surface
166: third upper surface
210: sealing layer
220: resin layer
222: upper surface
310: first structure
312: first side surface
314: second side surface
316: first upper surface
320: second structure
322: third side surface
324: fourth side surface
326: second upper surface
400: resist film
410: protective layer

The invention claimed is:

1. A light emitting device comprising:
a substrate;
a light emitting portion positioned over the substrate;
a first structure surrounding a light emitting region comprising the light emitting portion;
a second structure positioned outside the first structure with respect to the light emitting region and surrounding the light emitting region;
a sealing layer covering the light emitting portion, the first structure, and the second structure; and
a resin layer covering at least a portion of the sealing layer overlapping with the light emitting region,
wherein the first structure comprises a first side surface positioned at the light emitting region side, and a second side surface positioned opposite to the first side surface and inclined away from the light emitting region with distance from the substrate, and wherein the second structure comprises a third side surface positioned at the light emitting region side, and a fourth side surface positioned opposite to the third side surface and inclined away from the light emitting region with distance from the substrate.

2. The light emitting device according to claim 1, wherein the first side surface of the first structure is inclined toward the light emitting region side with distance from the substrate.

3. The light emitting device according to claim 1, further comprising:
a partition wall positioned between cathodes of adjacent light emitting portions, wherein the first structure comprises a same material as the partition wall.

4. The light emitting device according to claim 1, wherein an upper surface of the resin layer over the light emitting portion is positioned higher than an upper surface of the first structure with respect to the substrate.

5. The light emitting device according to claim 1, wherein the first structure continuously surrounds the light emitting region when viewed from a direction perpendicular to the substrate.

6. The light emitting device according to claim 1, wherein the first structure discontinuously surrounds the light emitting region when viewed from a direction perpendicular to the substrate.

7. The light emitting device according to claim 1, wherein the third side surface of the second structure is inclined toward the light emitting region side with distance from the substrate.

* * * * *